US012603258B2

(12) United States Patent
Torii et al.

(10) Patent No.: US 12,603,258 B2
(45) Date of Patent: *Apr. 14, 2026

(54) PLASMA PROCESSING APPARATUS AND PLASMA PROCESSING METHOD

(71) Applicant: Tokyo Electron Limited, Tokyo (JP)

(72) Inventors: Natsumi Torii, Miyagi (JP); Koichi Nagami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 281 days.

This patent is subject to a terminal disclaimer.

(21) Appl. No.: 18/136,692

(22) Filed: Apr. 19, 2023

(65) Prior Publication Data

US 2023/0260766 A1 Aug. 17, 2023

Related U.S. Application Data

(63) Continuation of application No. 17/376,771, filed on Jul. 15, 2021, now Pat. No. 11,646,181.

(30) Foreign Application Priority Data

Jul. 16, 2020 (JP) ................................. 2020-122121

(51) Int. Cl.
*H01J 37/32* (2006.01)

(52) U.S. Cl.
CPC .. *H01J 37/32715* (2013.01); *H01J 37/32183* (2013.01); *H01J 37/32642* (2013.01); *H01J 37/32935* (2013.01)

(58) Field of Classification Search
None
See application file for complete search history.

(56) References Cited

U.S. PATENT DOCUMENTS

| | | | | |
|---|---|---|---|---|
| 11,646,181 B2* | 5/2023 | Torii | ................. | H01J 37/32715 |
| | | | | 315/111.21 |
| 2008/0257869 A1* | 10/2008 | Nitschke | ........... | H01J 37/32935 |
| | | | | 219/121.54 |
| 2009/0026170 A1 | 1/2009 | Tanaka et al. | | |
| 2010/0025372 A1* | 2/2010 | Tsujimoto | ......... | H01J 37/32091 |
| | | | | 156/345.28 |
| 2014/0273487 A1* | 9/2014 | Deshmukh | .......... | H01L 21/6875 |
| | | | | 156/345.43 |
| 2015/0354061 A1* | 12/2015 | Dhas | ................. | H01L 21/67167 |
| | | | | 901/30 |

(Continued)

FOREIGN PATENT DOCUMENTS

| | | |
|---|---|---|
| JP | 2008-227063 A | 9/2008 |
| JP | 2019-004027 A | 1/2019 |

*Primary Examiner* — Wilson Lee
(74) *Attorney, Agent, or Firm* — XSENSUS LLP

(57) ABSTRACT

A plasma processing apparatus includes: a chamber; a substrate support disposed in the chamber, the substrate support including a lower electrode; an edge ring disposed to surround a substrate on the substrate support; an upper electrode disposed above the substrate support; a first RF power supply; a first DC power supply; and a controller configured to cause: (a) starting supply of a first RF power from the first RF power supply to the upper electrode or the lower electrode; and (b) after (a), starting the application of a first DC voltage from the first DC power supply to the edge ring when a first delay time elapses.

12 Claims, 10 Drawing Sheets

(56)　　　　　References Cited

U.S. PATENT DOCUMENTS

| | | | |
|---|---|---|---|
| 2017/0062190 A1* | 3/2017 | Lee .................. | H01J 37/32532 |
| 2019/0333741 A1* | 10/2019 | Nagami ............ | H01J 37/32715 |
| 2020/0075290 A1* | 3/2020 | Kawasaki ......... | H01J 37/32146 |
| 2020/0118794 A1* | 4/2020 | Koshimizu ....... | H01J 37/32027 |
| 2020/0144031 A1 | 5/2020 | Tamamushi et al. | |
| 2020/0219706 A1* | 7/2020 | Koshimizu ....... | H01J 37/32724 |
| 2020/0286741 A1* | 9/2020 | Yu ........................ | H01L 21/565 |
| 2020/0328063 A1 | 10/2020 | Bobek et al. | |
| 2020/0328064 A1 | 10/2020 | Bin Budiman et al. | |
| 2020/0395221 A1 | 12/2020 | Tahara et al. | |
| 2021/0043425 A1* | 2/2021 | Sawachi ........... | C23C 16/45544 |
| 2021/0210355 A1 | 7/2021 | Ventzek et al. | |
| 2022/0020576 A1* | 1/2022 | Torii ................ | H01J 37/32642 |

* cited by examiner

FIG. 6

|  | S1 | S2 | S3 | S4 | S5 | S6 | ⋯ |
|---|---|---|---|---|---|---|---|
| RF | OFF | ON | ON | OFF | OFF | ON | ⋯ |
| DC | OFF | OFF | ON | OFF | OFF | OFF | ⋯ |
| CHARGE REMOVAL | ON | OFF | OFF | OFF | ON | OFF | ⋯ |

PLASMA PROCESSING APPARATUS AND PLASMA PROCESSING METHOD

CROSS-REFERENCE TO RELATED APPLICATIONS

This application is a continuation application of U.S. patent application Ser. No. 17/376,771, filed on Jul. 15, 2021, which claims priority from Japanese Patent Application No. 2020-122121 filed on Jul. 16, 2020 with the Japan Patent Office, the disclosures of which are incorporated herein in their entirety by reference, and priority is claimed to each of the foregoing.

TECHNICAL FIELD

The present disclosure relates to a plasma processing apparatus and a plasma processing method.

BACKGROUND

Japanese Patent Laid-Open Publication No. 2008-227063 discloses a plasma processing apparatus including a substrate support disposed within a chamber to accommodate a wafer, and an edge ring. The edge ring is disposed so as to surround the wafer on the substrate support. In the plasma processing apparatus, plasma processing is performed on the wafer. In the plasma processing apparatus, a negative DC voltage is applied to the edge ring used up by plasma so that the distortion of a sheath is eliminated, and ions are allowed to vertically enter the entire surface of the wafer.

SUMMARY

According to an aspect of the present disclosure, a plasma processing apparatus includes: a chamber; a substrate support disposed in the chamber, the substrate support including a lower electrode; an edge ring disposed to surround a substrate on the substrate support; an upper electrode disposed above the substrate support; a first RF power supply; a first DC power supply; and a controller configured to cause: (a) starting supply of a first RF power from the first RF power supply to the upper electrode or the lower electrode; and (b) after (a), starting the application of a first DC voltage from the first DC power supply to the edge ring when a first delay time elapses.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 6 is a table illustrating RF ON/OFF, DC ON/OFF, and charge removal ON/OFF states in FIG. 5.

DESCRIPTION OF EMBODIMENT

Figure 1:
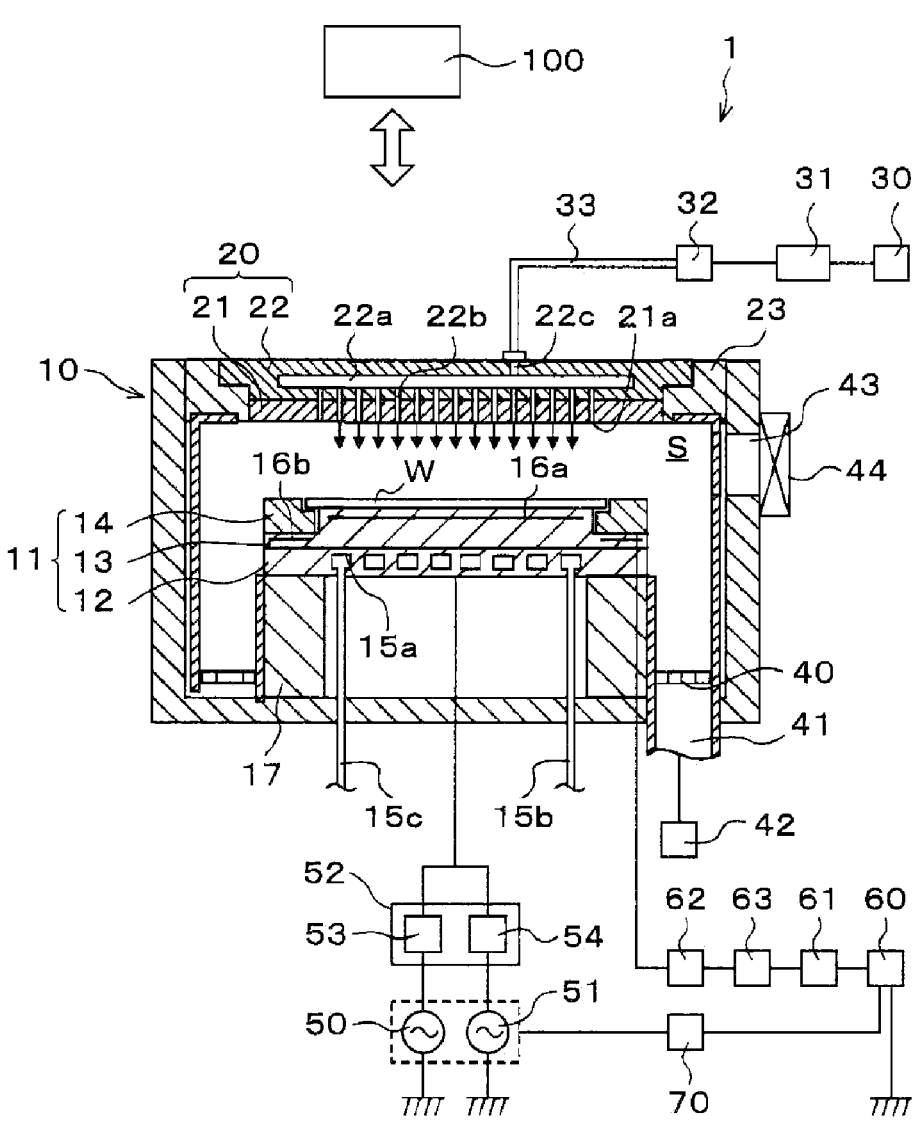
FIG. 1 is a vertical sectional view illustrating the outline of the configuration of a plasma processing apparatus according to the present embodiment.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

In the manufacturing process of a semiconductor device, plasma processing is performed on a semiconductor wafer (hereinafter, referred to as a "wafer"). In the plasma processing, a processing gas is excited so as to generate plasma, and the wafer is processed by the plasma.

The plasma processing is performed in a plasma processing apparatus. The plasma processing apparatus generally includes a chamber, a substrate support, and a radio-frequency (RF) power supply. As an example, the radio-frequency power supply includes a first radio-frequency power supply, and a second radio-frequency power supply. The first radio-frequency power supply supplies first radio-frequency power in order to generate plasma of a gas within the chamber. The second radio-frequency power supply supplies second radio-frequency power for bias to a lower electrode in order to attract ions to the wafer. The internal space of the chamber is defined as a processing space where the plasma is generated. The substrate support is provided within the chamber. The substrate support includes the lower electrode and an electrostatic chuck. The electrostatic chuck is provided on the lower electrode. On the electrostatic chuck, an edge ring is disposed to surround the wafer placed on the electrostatic chuck. The edge ring is provided to improve the uniformity of the plasma processing on the wafer.

The edge ring is consumed as the performance time of the plasma processing elapses. When the edge ring is consumed, the thickness of the edge ring is reduced. When the thickness of the edge ring is reduced, a sheath shape is changed above the edge ring and the edge area of the wafer. When the sheath shape is changed in this manner, the incident direction of ions in the edge area of the wafer is inclined with respect to the vertical direction. As a result, an opening formed in the edge area of the wafer is inclined with respect to the thickness direction of the wafer.

In order to form an opening that extends parallel to the thickness direction of the wafer in the edge area of the wafer, it is necessary to control the sheath shape above the edge ring and the edge area of the wafer so that the inclination (hereinafter, referred to as a "tilt angle" in some cases) of the direction in which ions enter the edge area of the wafer is adjusted. Therefore, in order to control the sheath shape above the edge ring and the edge area of the wafer, for example, Japanese Patent Laid-Open Publication No. 2008-227063 suggests a plasma processing apparatus that is configured such that a negative DC voltage is applied from a DC power supply to the edge ring.

However, in the plasma processing apparatus in the related art, since a high bias occurs, there is a concern that a discharge may occur due to a potential difference between the wafer and the edge ring when the radio-frequency power is supplied to the wafer in a pulsed manner. Thus, a function is implemented in the plasma processing apparatus, in which in synchronization with pulses of the radio-frequency power supply, a DC voltage is applied when the radio-frequency power is supplied, and the charges of the edge ring are removed when the supply of the radio-frequency power is stopped.

However, when the radio-frequency power is supplied in a pulsed manner, the bias does not immediately rise due to the influence of reflection of the radio-frequency power (reflected power). When the supply of the radio-frequency power is stopped, charges on the wafer are not immediately removed. Thus, when in synchronization with the radio-frequency power, the DC voltage is immediately applied to the edge ring or the charges of the edge ring are removed, there is a concern that a potential difference may occur between the wafer and the edge ring, thereby causing a discharge. Then, as a result, in some cases, the wafer may be damaged.

In the technology according to the present disclosure, a tilt angle in the edge area of a substrate is suitably controlled during plasma processing, while a discharge between the substrate and an edge ring is suppressed. Hereinafter, a plasma processing apparatus and a plasma processing method according to the present embodiment will be described with reference to drawings. In this specification and drawings, elements having substantially the same functional configurations are designated by the same reference numerals, and redundant descriptions thereof will be omitted.

<Plasma Processing Apparatus>

Figure 2:
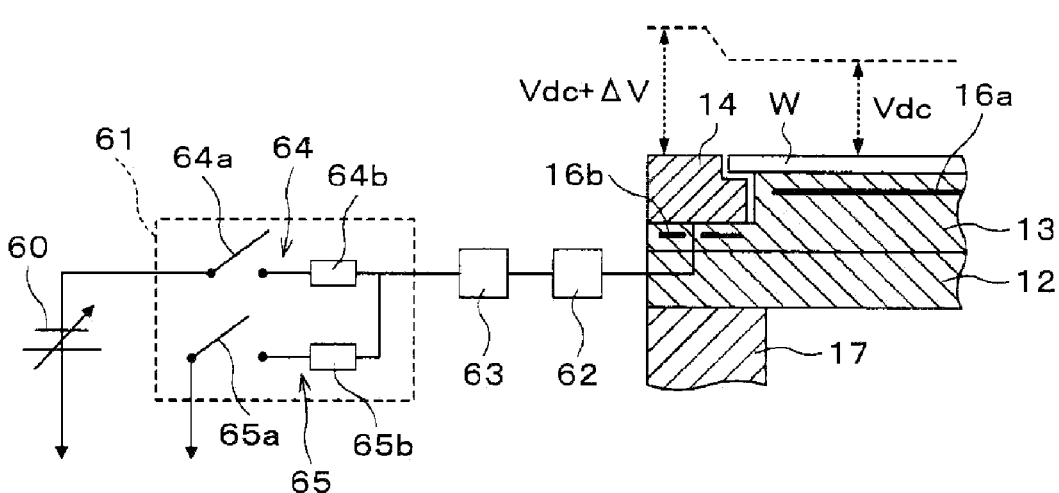
FIG. 2 is an explanatory view of a power supply system that applies a DC voltage to an edge ring in the present embodiment.

First, a plasma processing apparatus according to the present embodiment will be described. FIG. 1 is a vertical sectional view illustrating the outline of the configuration of a plasma processing apparatus 1. FIG. 2 is an explanatory view of a power supply system that applies a DC voltage to an edge ring 14. The plasma processing apparatus 1 is a capacitively coupled plasma processing apparatus. In the plasma processing apparatus 1, plasma processing is performed on a wafer W as a substrate. The plasma processing is not particularly limited, but, for example, etching processing, film formation processing, and diffusion processing are performed.

As illustrated in FIG. 1, the plasma processing apparatus 1 includes a chamber 10 that has a substantially cylindrical shape. The chamber 10 defines therein a processing space S where plasma is generated. The chamber 10 is made of, for example, aluminum. The chamber 10 is connected to a ground potential.

A substrate support 11 on which the wafer W is placed is accommodated in the chamber 10. The substrate support 11 includes a lower electrode 12, an electrostatic chuck 13, and the edge ring 14. An electrode plate (not illustrated) made of, for example, aluminum may be provided on the lower surface side of the lower electrode 12.

The lower electrode 12 is made of a conductive metal, for example, aluminum, and has substantially a disc shape.

A coolant flow path 15a is formed inside the lower electrode 12. A coolant is supplied to the coolant flow path 15a via a coolant inlet pipe 15b from a chiller unit (not illustrated) provided outside the chamber 10. The coolant supplied to the coolant flow path 15a is returned to the chiller unit via a coolant outlet flow path 15c. The coolant, for example, cooling water, circulates through the inside of the coolant flow path 15a, so that the electrostatic chuck 13, the edge ring 14, and the wafer W may be cooled to a desired temperature.

The electrostatic chuck 13 is provided on the lower electrode 12. The electrostatic chuck 13 is a member configured to be able to attract and hold both the wafer W and the edge ring 14 by an electrostatic force. The upper surface of the central portion of the electrostatic chuck 13 is formed at a position higher than the upper surface of the peripheral portion. The upper surface of the central portion of the electrostatic chuck 13 becomes a wafer placement surface on which the wafer W is placed, and the upper surface of the peripheral portion of the electrostatic chuck 13 becomes an edge ring placement surface on which the edge ring 14 is placed.

A first electrode 16a configured to attract and hold the wafer W is provided in the central portion inside the electrostatic chuck 13. A second electrode 16b configured to attract and hold the edge ring 14 is provided in the peripheral portion inside the electrostatic chuck 13. The electrostatic chuck 13 has a configuration where the electrodes 16a and 16b are interposed between insulators made of an insulating material.

A DC voltage is applied to the first electrode 16a from a DC power supply (not illustrated). Due to an electrostatic force generated by the DC voltage, the wafer W is attracted to and held by the upper surface of the central portion of the electrostatic chuck 13. Likewise, a DC voltage is applied to the second electrode 16b from the DC power supply (not illustrated). Due to an electrostatic force generated by the DC voltage, the edge ring 14 is attracted to and held by the upper surface of the peripheral portion of the electrostatic chuck 13.

In the present embodiment, the central portion of the electrostatic chuck 13 in which the first electrode 16a is provided, and the peripheral portion in which the second electrode 16b is provided are integrated, but the central portion and the peripheral portion may be separated.

The edge ring 14 is an annular member that is disposed to surround the wafer W placed on the upper surface of the central portion of the electrostatic chuck 13. The edge ring 14 is provided so as to improve the uniformity of plasma processing. Thus, the edge ring 14 is made of a material suitably selected according to the plasma processing, and may be made of, for example, a conductive material such as Si or SiC.

The substrate support 11 configured as described above is fastened to a substantially cylindrical support member 17 provided at the bottom of the chamber 10. The support member 17 is composed of an insulator made of, for example, ceramic or quartz.

Although not illustrated, the substrate support 11 may include a temperature control module configured to adjust at least one of the electrostatic chuck 13, the edge ring 14, and the wafer W to a desired temperature. The temperature control module may include a heater, a flow path, or a combination thereof. A temperature controlled fluid such as a coolant or a heat transfer gas flows through the flow path.

Above the substrate support 11, a shower head 20 is provided while facing the substrate support 11. The shower head 20 includes an electrode plate 21 that is disposed while facing the processing space S, and an electrode support 22 that is provided above the electrode plate 21. The electrode plate 21 functions as an upper electrode that is paired with the lower electrode 12. As described below, when a first radio-frequency power supply 50 is electrically connected to the lower electrode 12, the shower head 20 is connected to the ground potential. The shower head 20 is supported on the upper portion of the chamber 10 (the ceiling surface) via an insulating shielding member 23.

In the electrode plate 21, a plurality of gas jetting ports 21a is formed to supply a processing gas sent from a gas diffusion chamber 22a to be described below to the processing space S. The electrode plate 21 is composed of, for example, a conductor or a semiconductor that has a low electrical resistivity and generates less Joule's heat.

The electrode support 22 supports the electrode plate 21 such that the electrode plate 21 is freely detachable. The electrode support 22 has a configuration where a plasma-resistant film is formed on the surface of a conductive material such as, for example, aluminum. This film may be a film formed by anodizing, or a ceramic film such as a film made of yttrium oxide. The gas diffusion chamber 22a is formed within the electrode support 22. From the gas diffusion chamber 22a, a plurality of gas flow holes 22b is formed while communicating with the gas jetting ports 21a. In the gas diffusion chamber 22a, a gas introduction port 22c connected to a gas supply pipe 33 to be described below is formed.

A gas supply source group 30 that supplies a processing gas to the gas diffusion chamber 22a is connected to the electrode support 22 via a flow control device group 31, a valve group 32, the gas supply pipe 33, and the gas introduction port 22c.

The gas supply source group 30 includes a plurality of types of gas supply sources required for plasma processing. The flow control device group 31 includes a plurality of flow controllers, and the valve group 32 includes a plurality of valves. Each of the flow controllers in the flow control device group 31 is a mass flow controller or a pressure control type flow controller. In the plasma processing apparatus 1, a processing gas from one or more gas supply sources selected from the gas supply source group 30 is supplied to the gas diffusion chamber 22a via the flow control device group 31, the valve group 32, the gas supply pipe 33, and the gas introduction port 22c. Then, the processing gas supplied to the gas diffusion chamber 22a is dispersed in a shower form and is supplied into the processing space S via the gas flow holes 22b and the gas jetting ports 21a.

A baffle plate 40 is provided between the inner wall of the chamber 10 and the support member 17, at the bottom of the chamber 10. The baffle plate 40 is formed by coating, for example, an aluminum material with ceramic such as yttrium oxide. A plurality of through holes is formed in the baffle plate 40. The processing space S communicates with an exhaust port 41 through the baffle plate 40. In this configuration, for example, an exhaust device 42, such as a vacuum pump, is connected to the exhaust port 41, and the pressure within the processing space S can be reduced by the exhaust device 42.

A carry-in/out port 43 of the wafer W is formed in the side wall of the chamber 10, and the carry-in/out port 43 can be opened and closed by a gate valve 44.

The plasma processing apparatus 1 further includes the first radio-frequency power supply 50, a second radio-frequency power supply 51, and a matcher 52. The first radio-frequency power supply 50 and the second radio-frequency power supply 51 are connected to the lower electrode 12 via the matcher 52. The first radio-frequency power supply 50 and the second radio-frequency power supply 51 constitute a radio-frequency power supply in the present disclosure.

The first radio-frequency power supply 50 is a power supply that generates radio-frequency power for plasma generation. From the first radio-frequency power supply 50, radio-frequency power HF having a frequency of 27 MHz to 100 MHz, e.g., 40 MHz, is supplied to the lower electrode 12. The first radio-frequency power supply 50 is connected to the lower electrode 12 via a first matching circuit 53 of the matcher 52. The first matching circuit 53 is a circuit that matches the output impedance of the first radio-frequency power supply 50 to the input impedance on the load side [the lower electrode 12 side]. The first radio-frequency power supply 50 may not be electrically connected to the lower electrode 12, but may be connected to the shower head 20 that is the upper electrode via the first matching circuit 53.

The second radio-frequency power supply 51 generates radio-frequency power (radio-frequency bias power) LF for attracting ions to the wafer W, and supplies the radio-frequency power LF to the lower electrode 12. The frequency of the radio-frequency power LF may be a frequency ranging from 400 kHz to 13.56 MHz, and is, for example, 400 kHz. The second radio-frequency power supply 51 is connected to the lower electrode 12 via a second matching circuit 54 of the matcher 52. The second matching circuit 54 is a circuit that matches the output impedance of the second radio-frequency power supply 51 to the input impedance on the load side (the lower electrode 12 side).

In the following description, in some cases, a state where one or both of the radio-frequency power HF from the first radio-frequency power supply 50 and the radio-frequency power LF from the second radio-frequency power supply 51 is supplied to the lower electrode 12 may be referred to as "RF ON." In some cases, a state where neither the radio-frequency power HF nor the radio-frequency power LF is supplied to the lower electrode 12 may be referred to as "RF OFF." In some cases, the radio-frequency power HF and the radio-frequency power LF may be collectively referred to as "radio-frequency power RF."

As illustrated in FIG. 1 and FIG. 2, the plasma processing apparatus 1 further includes a direct current (DC) power supply 60, a switching unit 61, a first RF filter 62, and a second RF filter 63. The DC power supply 60 is electrically connected to the edge ring 14 via the switching unit 61, the second RF filter 63, and the first RF filter 62. In the present embodiment, the two RF filters 62 and 63 are provided for the DC power supply 60, but the number of RF filters is not limited thereto and may be, for example, one.

In the present embodiment, the DC power supply 60 is connected to the edge ring 14 via the switching unit 61, the first RF filter 62, and the second RF filter 63, but a power supply system that applies a DC voltage to the edge ring 14 is not limited thereto. For example, the DC power supply 60 may be electrically connected to the edge ring 14 via the switching unit 61, the second RF filter 63, the first RF filter 62, and the lower electrode 12.

The DC power supply 60 is a power supply that generates a negative DC voltage DC to be applied to the edge ring 14. The DC power supply 60 is a variable DC power supply, and the magnitude of the DC voltage DC can be adjusted.

The switching unit 61 is configured to be able to stop the application of the DC voltage DC to the edge ring 14 from the DC power supply 60. Specifically, the switching unit 61 switches between a DC power supply circuit 64 and a charge removal circuit 65 to be connected to the edge ring 14.

The DC power supply circuit 64 is a circuit that is connected to the DC power supply 60 and applies the DC voltage DC from the DC power supply 60 to the edge ring 14. As an example, the DC power supply circuit 64 includes a switching element 64a and a damping element 64b. For the switching element 64a, for example, a field effect transistor (FET) is used. Meanwhile, for the switching element 64a, besides the FET, an insulated gate bipolar transistor (IGBT) or a relay may be used. Then, in a state where the switching element 64a is closed (ON state), the edge ring 14 and the DC power supply 60 are connected, and the DC voltage DC is applied to the edge ring 14. Meanwhile, in a state where the switching element 64a is open (OFF state), the DC voltage DC is not applied to the edge ring 14. In the following description, in some cases, a state where the switching element 64a is turned ON may be referred to as "DC ON," and a state where the switching element 64a is turned OFF may be referred to as "DC OFF." The damping element 64b is, for example, a resistor or a coil, and its value or position can be freely determined by a designer.

The charge removal circuit 65 is a circuit that removes the charges of the edge ring 14. As an example, the charge removal circuit 65 includes a switching element 65a and a damping element 65b. For the switching element 65a, for example, a field effect transistor (FET) is used. Meanwhile, for the switching element 65a, besides the FET, an insulated gate bipolar transistor (IGBT) or a relay may be used. Then, in a state where the switching element 65a is closed (ON state), the edge ring 14 and the charge removal circuit 65 are connected, and charges of the edge ring 14 flow to the charge removal circuit 65, and then the charges of the edge ring 14 are removed. Meanwhile, in a state where the switching element 65a is open (OFF state), the charges of the edge ring 14 are not removed. In the following description, in some cases, a state where the switching element 65a is turned ON may be referred to as "charge removal ON," and a state where the switching element 65a is turned OFF may be referred to as "charge removal OFF." The damping element 65b is, for example, a resistor or a coil, and its value or position can be freely determined by a designer.

Each of the first RF filter 62 and the second RF filter 63 is a filter that reduces or blocks a radio frequency, and is provided to protect the DC power supply 60. The first RF filter 62 reduces or blocks, for example, a radio frequency of 40 MHz from the first radio-frequency power supply 50. The second RF filter 63 reduces or blocks, for example, a radio frequency of 400 kHz from the second radio-frequency power supply 51. A circuit configuration of the first RF filter 62 and the second RF filter 63 may be freely designed by those skilled in the art.

As illustrated in FIG. 1, the plasma processing apparatus 1 further includes a pulse signal source 70. The pulse signal source 70 sends a pulse signal, that is, a signal for controlling a pulse timing, to the first radio-frequency power supply 50, the second radio-frequency power supply 51, and the DC power supply 60. The first radio-frequency power supply 50 and the second radio-frequency power supply 51 supply the radio-frequency power HF and the radio-frequency power LF, respectively, in a pulsed manner, based on the pulse signal. In the DC power supply 60, the radio-frequency power HF, the radio-frequency power LF, and the DC voltage DC are applied in a pulsed manner, based on the pulse signal. Then, the pulse signal source 70 can control a synchronization timing between the radio-frequency power HF and the radio-frequency power LF, and the DC voltage DC. The pulse signal source may be embedded in each of the first radio-frequency power supply 50, the second radio-frequency power supply 51, and the DC power supply 60.

The plasma processing apparatus 1 further includes a measuring instrument (not illustrated) that measures a self-bias voltage of the edge ring 14 (or a self-bias voltage of the lower electrode 12 or the wafer W). The configuration of the measuring instrument may be freely designed by those skilled in the art.

In the above plasma processing apparatus 1, a controller 100 is provided. The controller 100 is a computer equipped with, for example, a CPU or a memory, and includes a program storage (not illustrated). In the program storage, a program that controls plasma processing in the plasma processing apparatus 1 is stored. The program may be recorded in a computer-readable storage medium, and then may be installed from the storage medium to the controller 100.

<Plasma Processing Method>

Next, descriptions will be made on plasma processing that is performed by using the plasma processing apparatus 1 configured as described above.

First, a wafer W is carried into the chamber 10, and the wafer W is placed on the electrostatic chuck 13. Then, a DC voltage DC is applied to the first electrode 16a of the electrostatic chuck 13 so that the wafer W is electrostatically attracted to and held by the electrostatic chuck 13 due to Coulomb force. After the wafer W is loaded, the pressure inside the chamber 10 is reduced to a desired degree of vacuum by the exhaust device 42.

Next, a processing gas is supplied to the processing space S from the gas supply source group 30 via the shower head 20. Radio-frequency power HF for plasma generation is supplied to the lower electrode 12 by the first radio-frequency power supply 50, so that the processing gas is excited, and plasma is generated. Here, radio-frequency power LF for ion attraction may be supplied by the second radio-frequency power supply 51. Then, due to the action of the generated plasma, plasma processing is performed on the wafer W.

In the completion of the plasma processing, first, the supply of the radio-frequency power HF from the first radio-frequency power supply 50 and the supply of the processing gas by the gas supply source group 30 are stopped. If the radio-frequency power LF has been supplied during the plasma processing, the supply of the radio-frequency power LF is also stopped. Subsequently, the supply of a heat transfer gas to the back surface of the wafer W is stopped, and the attraction and the holding of the wafer W by the electrostatic chuck 13 are stopped.

Then, the wafer W is carried out of the chamber 10, and a series of plasma processes on the wafer W is completed.

In the plasma processing, in some cases, the plasma may be generated by using only the radio-frequency power LF from the second radio-frequency power supply 51 without using the radio-frequency power HF from the first radio-frequency power supply 50.

<Tilt Angle Control Method>

Next, descriptions will be made on a method of controlling a tilt angle in the above described plasma processing. The tilt angle is an inclination (angle) of the direction in which ions enter the edge area of the wafer W, with respect to the vertical direction.

As an example, in a case of a state where the edge ring 14 is not consumed, the sheath shape is kept flat above the wafer W and the edge ring 14. Therefore, ions enter the entire surface of the wafer W in a substantially vertical direction (a vertical direction). That is, the tilt angle is 0 (zero).

Meanwhile, when the edge ring 14 is consumed, and the thickness of the edge ring 14 is reduced, the sheath thickness is reduced above the edge area of the wafer W and the edge ring 14, and the sheath shape is changed to a downward-convex shape. As a result, the direction in which ions enter the edge area of the wafer W is inclined with respect to the vertical direction. Then, in the edge area of the wafer W, an opening inclined with respect to the thickness direction is formed.

In some cases, the sheath thickness may increase, and the sheath shape may be an upward-convex shape above the edge area of the wafer W and the edge ring 14 with respect to the central area of the wafer W.

In the plasma processing apparatus 1 of the present embodiment, the tilt angle is controlled by adjusting a DC voltage DC from the DC power supply 60.

As illustrated in FIG. 2, in the DC power supply 60, as the DC voltage DC to be applied to the edge ring 14, a negative voltage whose absolute value is the sum of the absolute value of a self-bias voltage Vdc and a set value ΔV, that is, −(|Vdc|+ΔV) is set. In FIG. 2, dotted lines above the wafer W and the edge ring 14 indicate the potential of the wafer W and the potential of the edge ring 14, respectively. The self-bias voltage Vdc is a self-bias voltage of the wafer W, and is a self-bias voltage of the lower electrode 12 when radio-frequency power RF (one or both of HF and LF) is supplied, and the DC voltage DC from the DC power supply 60 is applied to the lower electrode 12. The set value ΔV is given by the controller 100.

The controller 100 specifies the set value ΔV from the consumption amount of the edge ring 14 (the amount of reduction of the thickness of the edge ring 14 from the initial value) and the consumption amount of the edge ring 14, which is estimated from process conditions of plasma processing (for example, a processing time) by using a predetermined function or table. That is, the controller 100 determines the set value ΔV by inputting the consumption amount of the edge ring 14 and the self-bias voltage to the function, or by referring to the table in using the consumption amount of the edge ring 14 and the self-bias voltage.

In determining the set value ΔV, the controller 100 may use, as the consumption amount of the edge ring 14, a difference between the initial thickness of the edge ring 14, and the thickness of the edge ring 14, which is actually measured by using, for example, a measuring instrument such as a laser measuring instrument or a camera. Otherwise, in order to determine the set value ΔV, the controller 100 may determine the consumption amount of the edge ring 14 from a specific parameter by using another predetermined function or table. The specific parameter may be any one of, for example, the self-bias voltage Vdc, a peak value Vpp of radio-frequency power HF or radio-frequency power LF, a load impedance, and electrical characteristics of the edge ring 14 or the vicinity of the edge ring 14. The electrical characteristics of the edge ring 14 or the vicinity of the edge ring 14 may be any one of, for example, a voltage, a current value, and a resistance value including the edge ring 14, at the edge ring 14 or any position around the edge ring 14. The other function or table is set in advance so as to determine the relationship between the specific parameter and the consumption amount of the edge ring 14. In order to determine the consumption amount of the edge ring 14, before the actual execution of plasma processing or during the maintenance of the plasma processing apparatus 1, the plasma processing apparatus 1 is operated under the measurement conditions for determining the consumption amount, that is, settings such as the radio-frequency power HF, the radio-frequency power LF, the pressure within the processing space S, and the flow rate of a processing gas supplied to the processing space S. Then, the specific parameter is acquired, and the consumption amount of the edge ring 14 is specified by inputting the specific parameter to the other function, or by referring to the other table in using the specific parameter.

In the plasma processing apparatus 1, during the plasma processing, that is, during a period in which radio-frequency power including one or both of the radio-frequency power HF and the radio-frequency power LF is supplied, the DC voltage DC is applied to the edge ring 14 from the DC power supply 60. Accordingly, the sheath shape above the edge ring 14 and the edge area of the wafer W is controlled, and then the inclination of the direction in which ions enter the edge area of the wafer W is reduced, and the tilt angle is controlled. As a result, an opening substantially parallel to the thickness direction of the wafer W is formed over the entire area of the wafer W.

More specifically, during the plasma processing, the self-bias voltage Vdc is measured by the measuring instrument (not illustrated). The DC voltage DC is applied from the DC power supply 60 to the edge ring 14. As described above, the value of the DC voltage DC to be applied to the edge ring 14 is −(|Vdc|+ΔV). |Vdc| is an absolute value of the measurement value of the self-bias voltage Vdc that has just been acquired by the measuring instrument, and ΔV is the set value determined by the controller 100. In this manner, from the self-bias voltage Vdc measured during the plasma processing, the DC voltage DC to be applied to the edge ring 14 is determined. Then, even if a change occurs in the self-bias voltage Vdc, the DC voltage DC generated by the DC power supply 60 is corrected, and the tilt angle is suitably corrected.

<Control Method of Radio-Frequency Power and DC Voltage>

Next, descriptions will be made on the supply timing of the radio-frequency power RF, the application timing of the DC voltage DC, and the charge removal timing of the edge ring 14 in the above described plasma processing. In the state of the supply of the radio-frequency power RF, one or both of the radio-frequency power HF from the first radio-frequency power supply 50 and the radio-frequency power LF from the second radio-frequency power supply 51 is supplied to the lower electrode 12. The supply timing of the radio-frequency power RF is, that is, the above described RF ON/OFF timings. In the state of the application of the DC voltage DC, the edge ring 14 and the DC power supply 60 (the DC power supply circuit 64) are connected, and the application timing of the DC voltage DC is, that is, the above described DC ON/OFF timings. In the state of the charge removal of the edge ring 14, the edge ring 14 and the charge removal circuit 65 are connected, and the charge removal timing of the edge ring 14 is, that is, the above described charge removal ON/OFF timings.

[Principle of Delay Time Dt]

Here, in order to control the tilt angle as described above, the DC voltage DC to be applied from the DC power supply 60 to the edge ring 14 is adjusted, and a set value ΔV which is a potential difference is set between the wafer W and the edge ring 14. Here, for example, if the potential difference becomes too large, or if an unintended potential difference occurs due to missing of the application timing of the DC voltage DC, there is a concern that a discharge may occur between the wafer W and the edge ring 14. Then, as a result, in some cases, the wafer W may be damaged.

Therefore, in the present embodiment, a delay time (dead time) function for the pulse timing in the DC power supply 60 is applicably used so that a floating potential state is formed at the output end of the DC power supply 60, and the edge ring 14 has an ability to follow the change in the potential of the wafer W.

A delay time function generally provided in the switching unit 61 is a function in which when the DC power supply circuit 64 and the charge removal circuit 65 are switched, a delay occurs in switching to one circuit so that these two circuits are not simultaneously turned ON. When two circuits are simultaneously turned ON, a short circuit occurs. Thus, such a delay time function is set. When the radio-frequency power RF is supplied in a pulsed manner, a pulse signal is sent from the pulse signal source 70, and is used as a synchronization signal for the first radio-frequency power supply 50, the second radio-frequency power supply 51, and the DC power supply 60. In the delay time function, a delay time is set for the pulse signal. Then, during the delay time, the DC power supply 60 is in an unstable state that is neither an ON state nor an OFF state. In the following description, in some cases, a normal delay time may be referred to as a "delay time Do," and a delay time in the present embodiment may be referred to as a "delay time Dt."

Figure 3A:
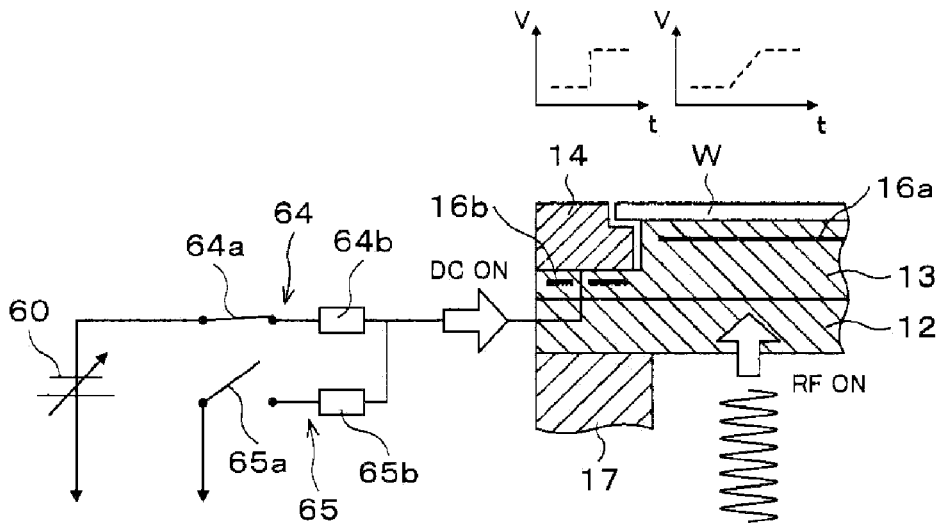
FIGS. 3A and 3B are explanatory views illustrating RF ON/OFF, DC ON/OFF, and charge removal ON/OFF states in the related art.
Figure 3B:
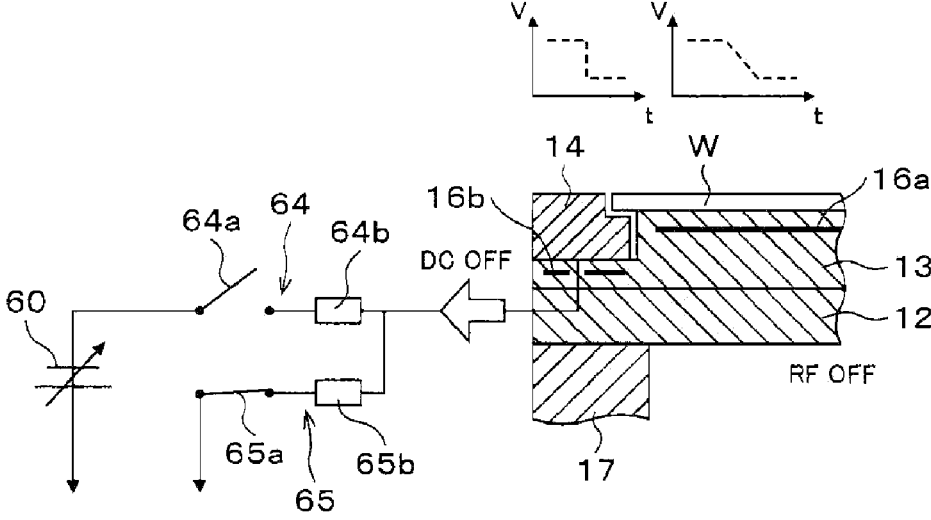
Figure 4A:
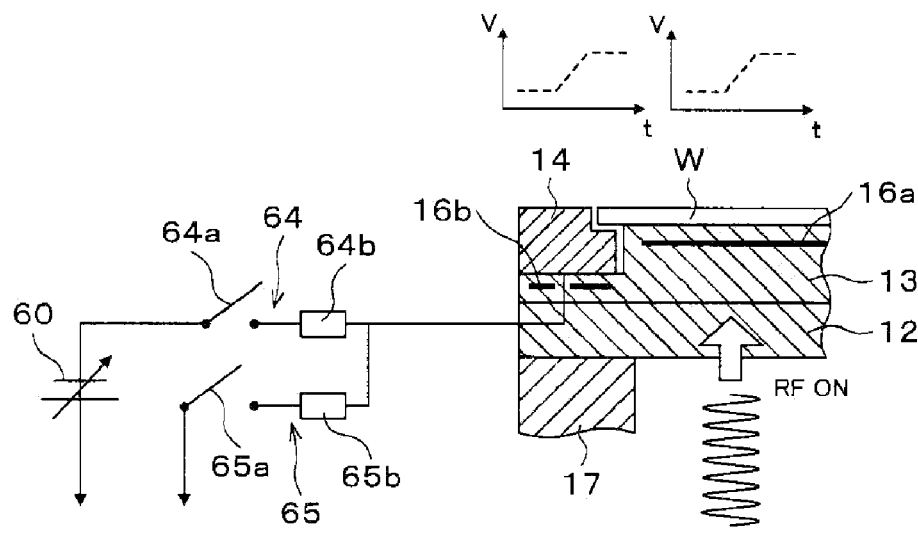
FIGS. 4A and 4B are explanatory views illustrating RF ON/OFF, DC ON/OFF, and charge removal ON/OFF states in the present embodiment.
Figure 4B:
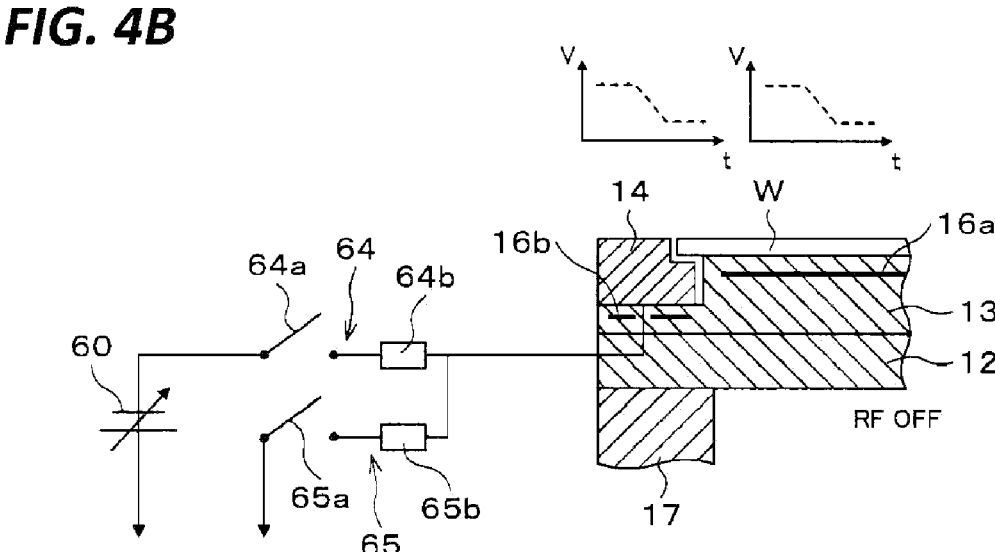

In the present embodiment, each of timings for RF ON/OFF, DC ON/OFF, and charge removal ON/OFF states is controlled. FIGS. 3A and 3B are explanatory views illustrating RF ON/OFF, DC ON/OFF, and charge removal ON/OFF states in the related art, in Comparative Example of the present embodiment. In FIGS. 3A and 3B, the above described delay time Do normally provided for the switching unit 61 is present while the delay time Dt in the present embodiment is not set. Meanwhile, FIGS. 4A and 4B are explanatory views illustrating RF ON/OFF, DC ON/OFF, and charge removal ON/OFF states in the present embodiment. In FIGS. 3A and 3B and FIGS. 4A and 4B, dotted line graphs illustrated above the wafer W and the edge ring 14 schematically illustrate temporal changes of the potential of the wafer W and the potential of the edge ring 14, respectively. That is, the vertical axis of the dotted line graph is a potential, and the horizontal axis is a time. In order to facilitate the understanding of the technique, illustration of the first RF filter 62 and the second RF filter 63 is omitted in FIGS. 3A and 3B and FIGS. 4A and 4B.

In the related art, as illustrated in FIG. 3A, when the radio-frequency power RF is supplied to the lower electrode 12 (RF ON), the DC voltage DC is applied to the edge ring 14 (DC ON, charge removal OFF). In such a case, when RF is turned ON, the reflection of the radio-frequency power RF is generated and then the radio-frequency power RF supplied to the lower electrode 12 gradually rises. Thus, the potential generated on the wafer W due to the radio-frequency power RF also gradually slowly rises from the timing of when RF is turned ON. Meanwhile, since the DC power supply 60 normally quickly rises, the potential of the edge ring 14 sharply rises, and becomes the same as the potential of the DC power supply 60. Thus, there is a concern that a potential difference larger than intended may occur between the wafer W and the edge ring 14, and a discharge may be generated between the wafer W and the edge ring 14.

In the related art, as illustrated in FIG. 3B, when the supply of the radio-frequency power RF to the lower electrode 12 is stopped (RF OFF), the application of the DC voltage DC to the edge ring 14 is stopped (DC OFF), and the charges of the edge ring 14 are removed (charge removal ON). In such a case, when RF is turned OFF, the charges are gradually removed by the time constant of hardware (device) or plasma. Thus, the potential on the wafer W gradually slowly falls. Meanwhile, the potential of the edge ring 14 sharply falls, and becomes substantially 0 (zero) V. Thus, there is a concern that a potential difference larger than intended may occur between the wafer W and the edge ring 14, and a discharge may be generated between the wafer W and the edge ring 14.

Meanwhile, in the present embodiment, in the supply of the radio-frequency power RF to the lower electrode 12 (RF ON), and the application of the DC voltage DC to the edge ring 14 (DC ON), DC is turned ON after a first delay time Dt1 elapses since RF is turned ON. Here, in the case of the delay time Do normally provided for the switching unit 61, since the DC power supply 60 is in an unstable state that is neither an ON state nor an OFF state, it is desirable to make the delay time Do as short as possible. Meanwhile, in the first delay time Dt1 of the present embodiment, as illustrated in FIG. 4A, while the switching element 64a of the DC power supply circuit 64 is opened, the switching element 65a of the charge removal circuit 65 is placed in an open state, so that in an unstable state, the output end of the DC power supply 60 has a floating potential. That is, an idle state where neither the DC power supply circuit 64 nor the charge removal circuit 65 is used is set, so that during the first delay time Dt1, the output end of the DC power supply 60 has a floating potential. In this floating potential state, the potential of the edge ring 14 changes similarly to that of the wafer W. Thus, at the point in time when the first delay time Dt1 has elapsed, a potential difference between the wafer W and the edge ring 14 is small. Then, after the first delay time Dt1 elapses, DC is turned ON. In such a case, the potential of the edge ring 14 becomes the same as the potential of the wafer W (the potential of plasma and sheath), and then, may become the self-bias voltage Vdc based on the radio-frequency power RF (excluding the generated reflection). Then, the potential of the edge ring 14 gradually rises while following the potential of the wafer W. Therefore, the potential difference between the wafer W and the edge ring 14 can be suppressed.

In the present embodiment, when the supply of the radio-frequency power RF to the lower electrode 12 is stopped (RF OFF), the application of the DC voltage DC to the edge ring 14 is stopped (DC OFF), and the charges of the edge ring 14 are removed (charge removal ON), the charge removal is turned ON after a second delay time Dt2 elapses since DC is turned OFF. That is, in the second delay time Dt2, as illustrated in FIG. 4B, while the switching element 64a of the DC power supply circuit 64 is opened, the switching element 65a of the charge removal circuit 65 is placed in an open state, so that in an unstable state, the output end of the DC power supply 60 has a floating potential. That is, an idle state where neither the DC power supply circuit 64 nor the charge removal circuit 65 is used is set, so that during the second delay time Dt2, the output end of the DC power supply 60 has a floating potential. Then, after the second delay time Dt2 of the floating potential state elapses, the charge removal is turned ON. In such a case, the potential of the edge ring 14 may become the same as the potential of the wafer W, and gradually falls while following the potential of the wafer W. Therefore, the potential difference between the wafer W and the edge ring 14 can be suppressed.

[Timings of RF ON/OFF, DC ON/OFF, and Charge Removal ON/OFF]

As described above, in the present embodiment, when RF is turned ON and turned OFF, the delay times Dt1 and Dt2 are set, respectively, so that the potential difference between the wafer W and the edge ring 14 is suppressed. Hereinafter, RF ON/OFF, DC ON/OFF, and charge removal ON/OFF timings in the above described plasma processing will be specifically described.

Figure 5:
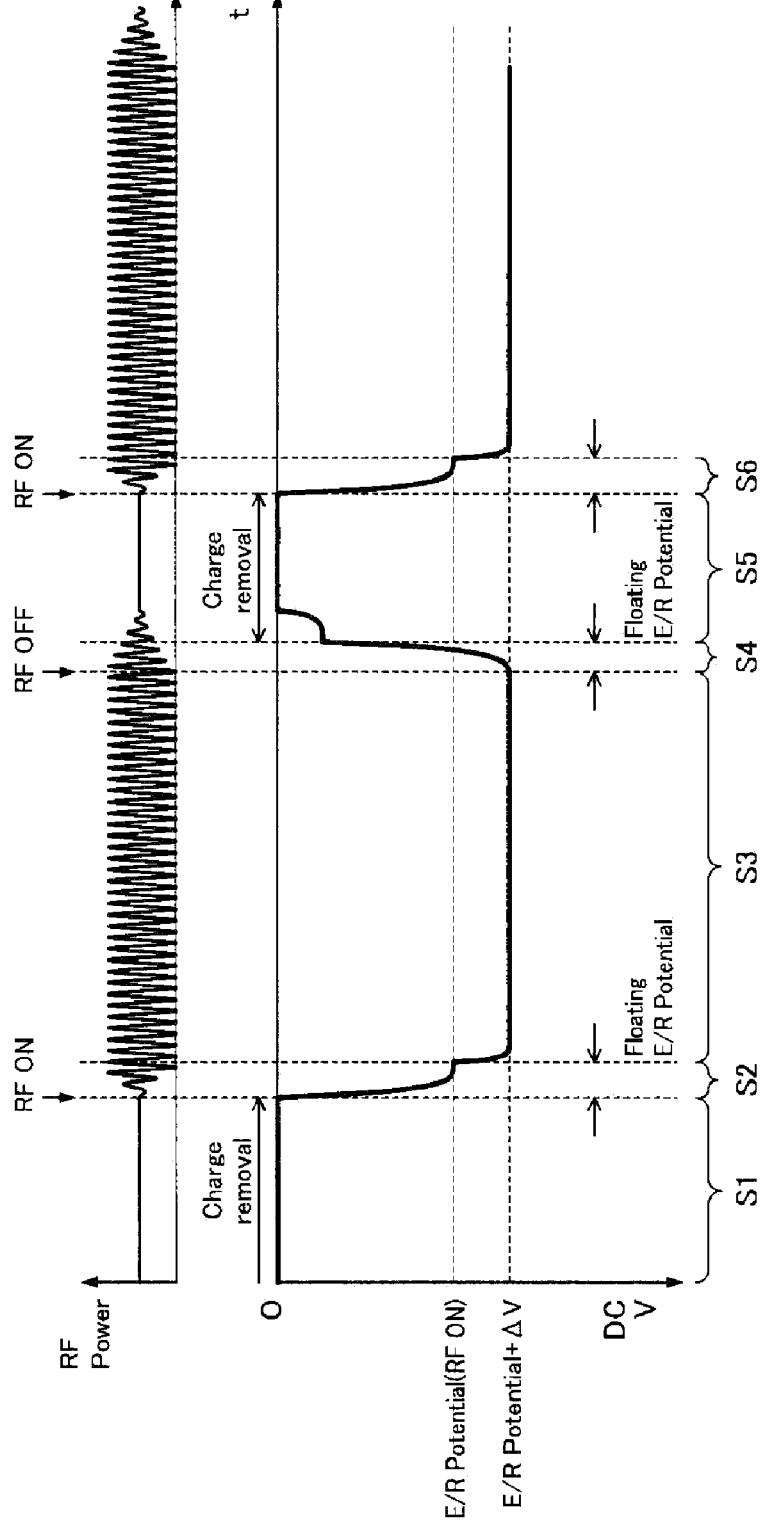
FIG. 5 is an explanatory view illustrating temporal changes of radio-frequency power and a DC voltage in the present embodiment.
Figure 7:
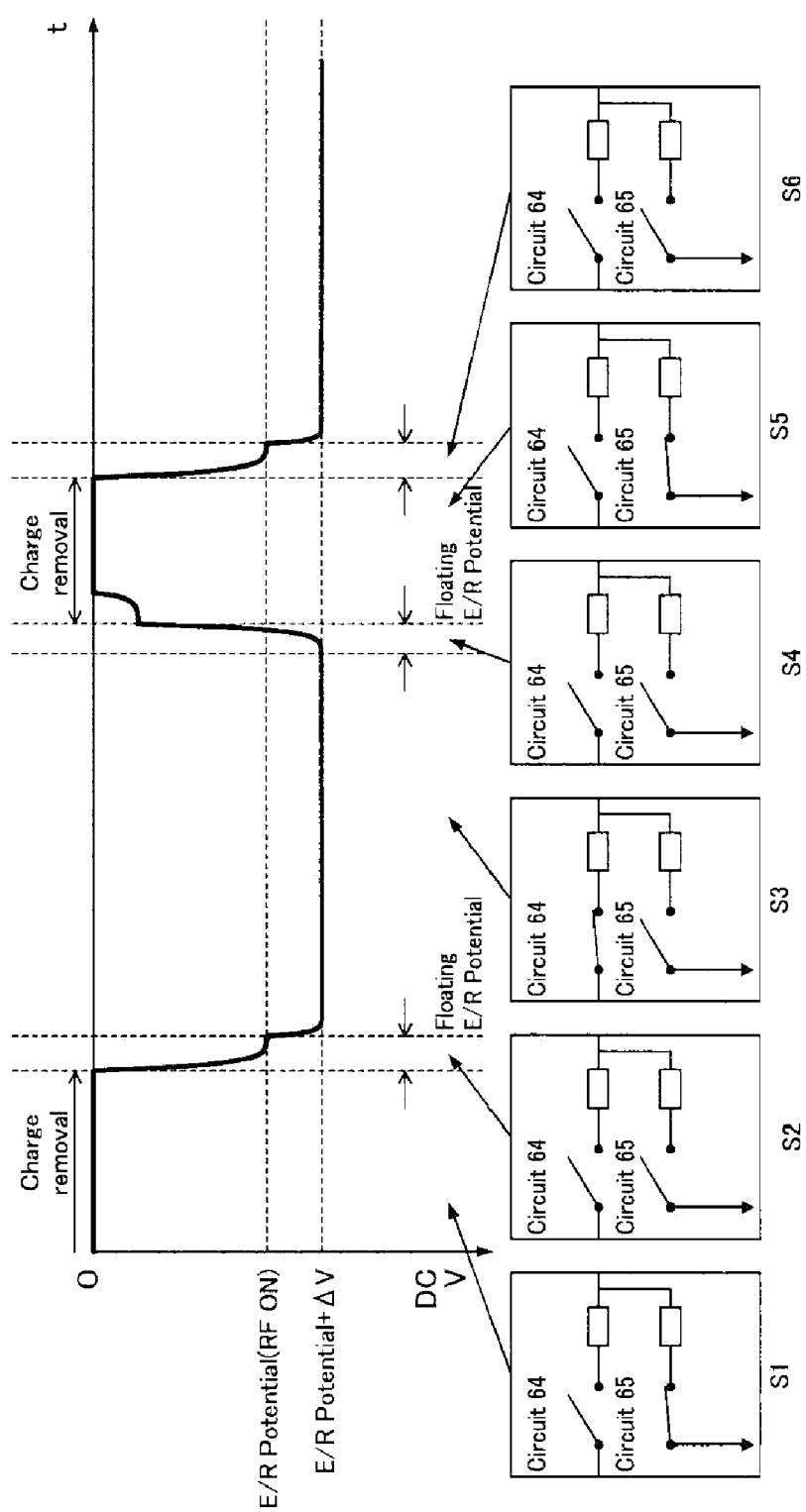
FIG. 7 is an explanatory view illustrating the states of a DC power supply circuit and a charge removal circuit in FIG. 5.

FIG. 5 is an explanatory view illustrating temporal changes of the radio-frequency power RF and the DC voltage DC. The vertical axis of the upper graph in FIG. 5 is the radio-frequency power RF, and the horizontal axis is the time t. The vertical axis of the lower graph in FIG. 5 is the DC voltage DC, and the horizontal axis is the time t. FIG. 6 is a table illustrating RF ON/OFF, DC ON/OFF, and charge removal ON/OFF states in FIG. 5. FIG. 7 is an explanatory view illustrating the states of the DC power supply circuit 64 and the charge removal circuit 65 in FIG. 5.

(step S1) A step S1 is a step of performing charge removal of the edge ring 14. In the step S1, the switching element 64a of the DC power supply circuit 64 is opened (DC OFF), and the switching element 65a of the charge removal circuit 65 is closed (charge removal ON). Then, the edge ring 14 and the charge removal circuit 65 are connected, and charges of the edge ring 14 are removed through the charge removal circuit 65. In the step S1, the supply of the radio-frequency power RF to the lower electrode 12 is stopped (RF OFF).

(step S2) A step S2 is a step of the first delay time Dt1 until the DC voltage DC is applied to the edge ring 14 (DC ON) after the radio-frequency power RF is supplied to the lower electrode 12 (RF ON). In the step S2, while the switching element 64a of the DC power supply circuit 64 is kept open (DC OFF), the switching element 65a of the charge removal circuit 65 is opened (charge removal OFF). That is, the edge ring 14 is connected to neither the DC power supply circuit 64 nor the charge removal circuit 65, and thus the output end of the DC power supply 60 has a floating potential. When RF is turned ON, since reflection of the radio-frequency power RF is generated, the potential of the wafer W gradually rises. Then, in the floating potential state of the DC power supply 60, the potential of the edge ring 14 gradually rises while following the potential of the wafer W. Therefore, at the point in time when the first delay time Dt1 has elapsed, the potential difference between the wafer W and the edge ring 14 can be reduced, thereby suppressing a discharge.

(step S3) A step S3 is a step of applying the DC voltage DC to the edge ring 14 (DC ON), and performing plasma processing on the wafer W, during the supply of the radio-frequency power RF to the lower electrode 12 (RF ON). In the step S3, while the switching element 65a of the charge removal circuit 65 is kept open (charge removal OFF), the switching element 64a of the DC power supply circuit 64 is closed (DC ON). Then, the tilt angle in the edge area of the wafer W is suitably controlled by the DC voltage DC, so that the incident direction of ions can be properly adjusted, and the plasma processing can be uniformly performed on the wafer W.

(step S4) A step S4 is a step of the second delay time Dt2 until the charge removal of the edge ring 14 is performed (charge removal ON) after the supply of the radio-frequency power RF to the lower electrode 12 is stopped (RF OFF), and the application of the DC voltage DC to the edge ring 14 is stopped (DC OFF). In the step S4, while the switching element 65a of the charge removal circuit 65 is kept open (charge removal OFF), the switching element 64a of the DC power supply circuit 64 is opened (DC OFF). That is, the edge ring 14 is connected to neither the DC power supply circuit 64 nor the charge removal circuit 65, and thus the output end of the DC power supply has a floating potential. When RF is turned OFF, the potential of the wafer W gradually falls. Then, in the floating potential state of the DC power supply 60, the potential of the edge ring 14 gradually falls while following the potential of the wafer W. Therefore, at the point in time when the second delay time Dt2 has elapsed, the potential difference between the wafer W and the edge ring 14 can be reduced, thereby suppressing a discharge.

(step S5) A step S5 is a step of removing the charges of the edge ring 14. In the step S5, as in the step S1, while the switching element 64a of the DC power supply circuit 64 is kept open (DC OFF), the switching element 65a of the charge removal circuit 65 is closed (charge removal ON). Then, the edge ring 14 and the charge removal circuit 65 are connected, and charges of the edge ring 14 are removed through the charge removal circuit 65.

(step S6) A step S6 is a step of the first delay time Dt1 until the DC voltage DC is applied to the edge ring 14 (DC ON) after the radio-frequency power RF is supplied to the lower electrode 12 again (RF ON). That is, the step S6 is the same step as the step S2.

The steps S1 to S4 are repeatedly performed as described above, and then a series of plasma processes is completed.

According to the present embodiment, in the supply of the radio-frequency power RF to the lower electrode 12 (RF ON), and the application of the DC voltage DC to the edge ring 14 (DC ON), DC is turned ON after the first delay time Dt1 elapses since RF is turned ON. In such a case, the potential of the edge ring 14 gradually rises while following the potential of the wafer W. Therefore, the potential difference between the wafer W and the edge ring 14 can be suppressed.

When the supply of the radio-frequency power RF to the lower electrode 12 is stopped (RF OFF), the application of the DC voltage DC to the edge ring 14 is stopped (DC OFF), and the charges of the edge ring 14 are removed (charge removal ON), the charge removal is turned ON after the second delay time Dt2 elapses since DC is turned OFF. In such a case, the potential of the edge ring 14 gradually falls while following the potential of the wafer W. Therefore, the potential difference between the wafer W and the edge ring 14 can be suppressed.

When an existing function is set for the function of the present embodiment, generally, two pulse timing signals are used, that is, timing signals capable of determining three states including a DC ON state, a DC OFF state, and a floating potential state are required. Therefore, the device configuration becomes highly complicated.

In this respect, in the present embodiment, the delay times Dt1 and Dt2 are used so that for any DC power supply, it is possible to determine the timing of when the potential of the edge ring 14 follows the potential of the wafer W. Also, since the timing of the floating potential is formed on the DC power supply 60 side, the same pulse timing signal as that for the radio-frequency power RF can be used. That is, since the existing pulse signal source 70 can be used, there is no need to prepare the pulse signal source 70 again.

<Specific Example of Delay Time Dt>

Next, descriptions will be made on specific examples of the above described first delay time Dt1 when RF is turned ON, and the second delay time Dt2 when RF is turned OFF.

First, for a comparison with the delay times Dt1 and Dt2, descriptions will be made on a specific example of the delay time Do included in the normal switching unit 61. The factor that determines the delay time Do is a switching speed of the FET included in the switching unit 61. Specifically, the delay time Do is a time obtained by adding a margin time (a margin) to the rising time or the falling time of the FET. For example, after the time elapses until the FET of the DC power supply circuit 64 is completely turned OFF (falling), when an instruction is made on the timing of when the charge removal circuit 65 is turned ON, the delay time Do is a time obtained by adding the falling time and the margin. The rising time and the falling time vary depending on types of elements, but are, for example, 1 ns to 10 ns. The delay time Do is, for example, 1 ns to 100 ns.

A constraint condition common to the delay times Dt1 and Dt2 is the ratio of the delay times Dt1 and Dt2 to the time (DC ON time) during which the DC voltage DC is applied to the edge ring 14. Since the delay times Dt1 and Dt2 are times during which the DC voltage DC is not applied, when the delay times Dt1 and Dt2 become long, a deviation from the application state of the DC voltage DC synchronized with the radio-frequency power RF occurs. Therefore, based on the DC ON time, the delay times Dt1 and Dt2 are determined. The minimum required ratio of the delay times Dt1 and Dt2 is determined from the process evaluation result of the plasma processing.

The specific method of determining the first delay time Dt1 when RF is turned ON is as follows. That is, a reflection time after the supply of the radio-frequency power RF is measured in advance, and a time equal to or longer than the reflection time is determined as the first delay time Dt1. Otherwise, the potential of the edge ring 14 may be measured, and the first delay time Dt1 may be determined, based on the radio-frequency power RF and the potential of the edge ring 14. Then, the first delay time Dt1 is determined to be, for example, 0.1 μs to 1000 μs, more preferably more than 0.1 μs and 1000 μs or less, 0.1 μs to 100 μs, 1 μs to 1000 μs, or 1 μs to 300 μs. As described below, the upper limit value of the first delay time Dt1 is determined as a time required when a potential difference between a second DC voltage DC2 and a first DC voltage DC1 is removed by using plasma.

The specific method of determining the second delay time Dt2 when RF is turned OFF is as follows. That is, the potential of the edge ring 14 is measured, and the second delay time Dt2 is determined such that the charges of the edge ring 14 are removed after the potential of the edge ring 14 sufficiently completely falls. Otherwise, the radio-frequency power RF may be measured, and the second delay time Dt2 may be determined based on only the radio-frequency power RF. Then, the second delay time Dt2 is determined to be, for example, 0.1 μs to 1,000 μs, more preferably more than 0.1 μs and 1000 μs or less, 0.1 μs to 100 μs, 1 μs to 1000 μs, or 1 μs to 300 μs.

Other Embodiments

Figure 8A:
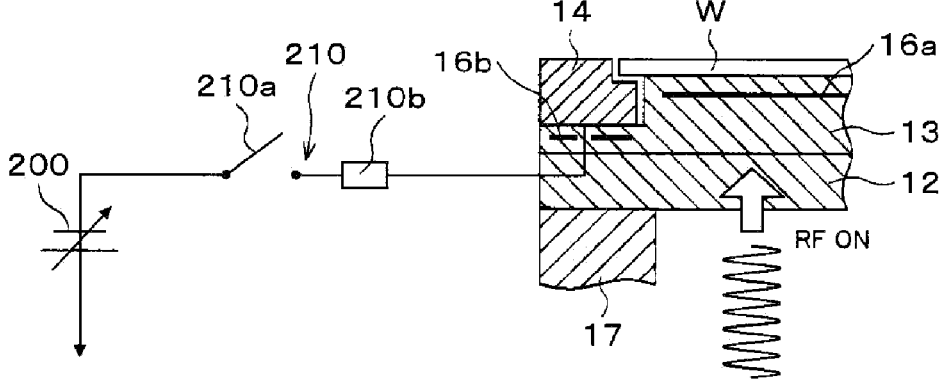
FIGS. 8A to 8C are explanatory views of a power supply system that applies a DC voltage to an edge ring in another embodiment.
Figure 8B:
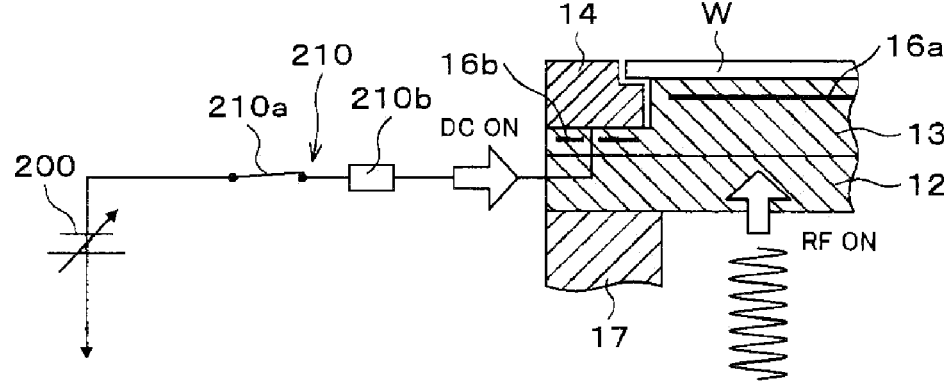
Figure 8C:
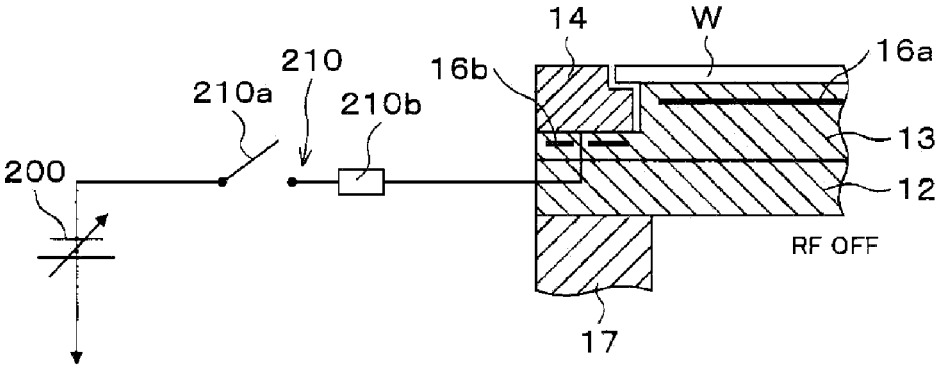

The plasma processing apparatus 1 of the above embodiment includes the DC power supply 60, the DC power supply circuit 64 and the charge removal circuit 65, but the power supply system that applies the DC voltage DC to the edge ring 14 is not limited thereto. FIGS. 8A to 8C, FIGS.

Figure 9A:
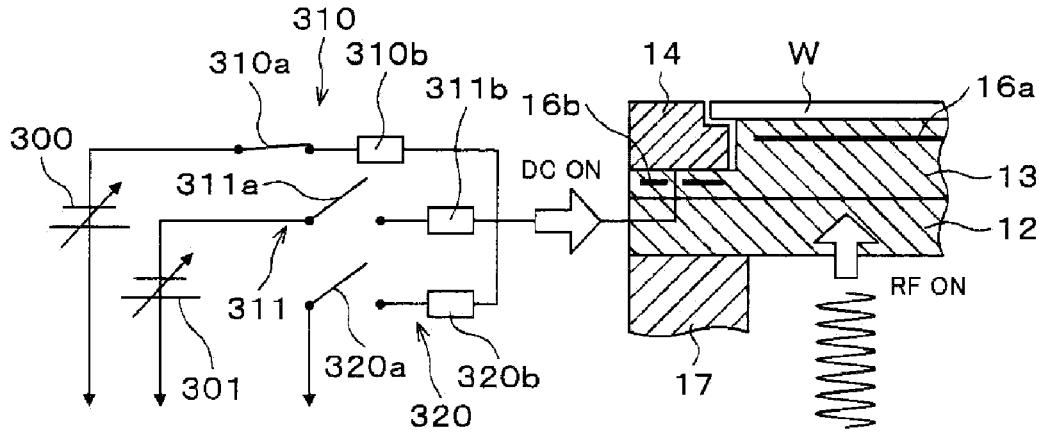
FIGS. 9A and 9B are explanatory views of a power supply system that applies a DC voltage to an edge ring in another embodiment.
Figure 9B:
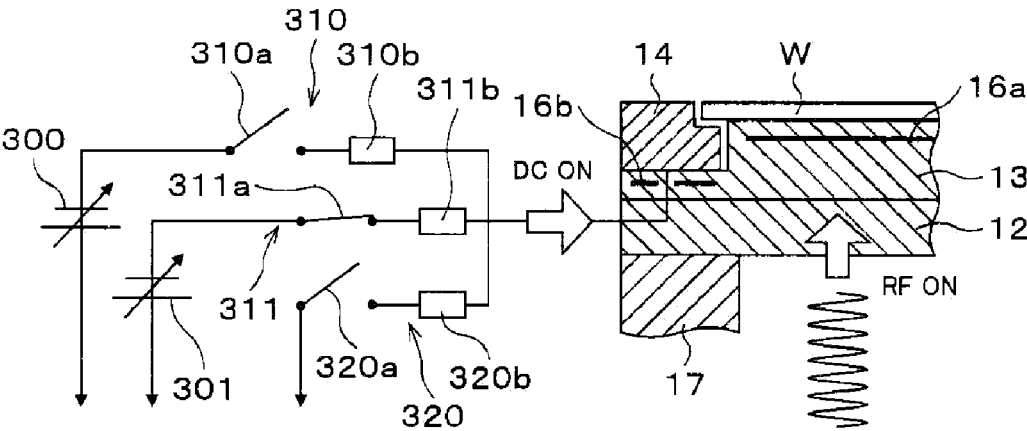
Figure 10:
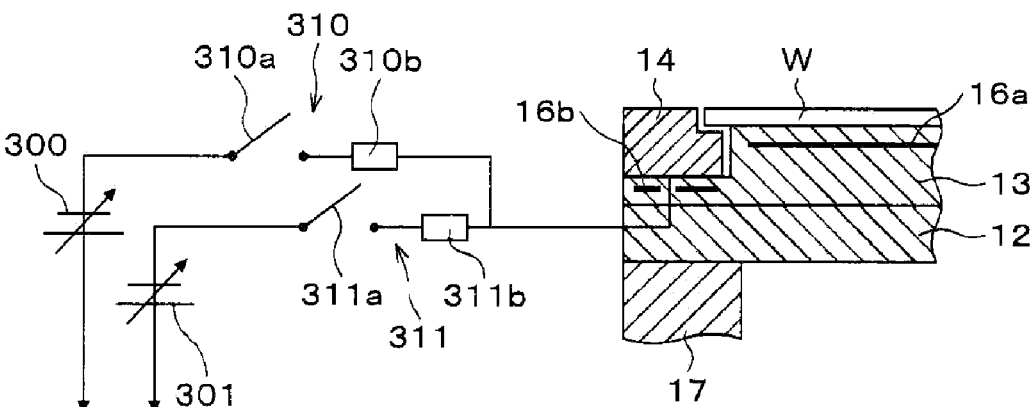
FIG. 10 is an explanatory view of a power supply system that applies a DC voltage to an edge ring in another embodiment.

9A and 9B, and FIG. 10 are explanatory views of a power supply system that applies a DC voltage DC to the edge ring 14, in other embodiments. In FIGS. 8A to 8C, FIGS. 9A and 9B, and FIG. 10, in order to facilitate understanding of the technique, illustration of the first RF filter 62 and the second RF filter 63 is omitted.

As illustrated in FIGS. 8A to 8C, the plasma processing apparatus 1 may include a DC power supply 200 and a DC power supply circuit 210 instead of the DC power supply 60, the DC power supply circuit 64 and the charge removal circuit 65. That is, the plasma processing apparatus 1 of the present embodiment does not include a charge removal circuit. The DC power supply circuit 210 includes a switching element 210a and a damping element 210b.

In such a case, as illustrated in FIG. 8A, immediately after the radio-frequency power RF is supplied to the lower electrode 12 (RF ON), the switching element 210a is opened so that the DC voltage DC is not applied to the edge ring 14 (DC OFF).

Then, as illustrated in FIG. 8B, after a delay time Dt elapses, the switching element 210a is closed so that the DC voltage DC is applied to the edge ring 14 (DC ON). In such a case, after the potential of the edge ring 14 follows the potential of the wafer W, the DC voltage DC is applied to the edge ring 14. As a result, the potential difference between the wafer W and the edge ring 14 can be reduced, thereby suppressing a discharge. Then, plasma processing is performed on the wafer W.

Next, as illustrated in FIG. 8C, when the application of the radio-frequency power RF to the lower electrode 12 is stopped (RF OFF), the switching element 210a is opened so that the application of the DC voltage DC to the edge ring 14 is stopped.

As illustrated in FIGS. 9A and 9B, the plasma processing apparatus 1 may include a first DC power supply 300, a second DC power supply 301, a first DC power supply circuit 310, a second DC power supply circuit 311, and a charge removal circuit 320 instead of the DC power supply 60, the DC power supply circuit 64 and the charge removal circuit 65. The first DC power supply 300 applies a first DC voltage DC1 to the edge ring 14. The second DC power supply 301 applies a second DC voltage DC2 different from the first DC voltage DC1 to the edge ring 14. The first DC power supply circuit 310 includes a switching element 310a and a damping element 310b. The second DC power supply circuit 311 includes a switching element 311a and a damping element 311b. The charge removal circuit 320 includes a switching element 320a and a damping element 320b.

For example, when the radio-frequency power RF is supplied to the lower electrode 12 (RF ON), if it is desired to switch DC voltages DC to be applied to the edge ring 14 at a radio-speed, the first DC power supply circuit 310 and the second DC power supply circuit 311 are switched, and then the first DC voltage DC1 and the second DC voltage DC2 are switched. For example, when the first DC voltage DC1 is smaller than the second DC voltage DC2, as illustrated in FIG. 9A, the first DC voltage DC1 may be applied to the edge ring 14, and then, as illustrated in FIG. 9B, the second DC voltage DC2 may be applied to the edge ring 14.

Then, in the present embodiment as well, as in the above described embodiment, when RF is turned ON, the first delay time Dt1 is set, and when RF is turned OFF, the second delay time Dt2 is set. Specifically, the first delay time Dt1 is set for a time until the first DC voltage DC1 is applied to the edge ring 14 after the radio-frequency power RF is supplied to the lower electrode 12. The second delay time Dt2 is set for a time until the charges of the edge ring 14 are removed after the supply of the radio-frequency power RF to the lower electrode 12 is stopped, and the application of the second DC voltage DC2 to the edge ring 14 is stopped. A delay time Dt may also be set between the application of the first DC voltage DC1 and the second DC voltage DC2.

When the first DC voltage DC1 is smaller than the second DC voltage DC2, it is necessary to perform the switching from the second DC voltage DC2 to the first DC voltage DC1 while the charge removal of the edge ring 14 by the charge removal circuit 320 is interposed between the second DC voltage DC2 and the first DC voltage DC1. That is, the application of the second DC voltage DC2, the charge removal of the edge ring 14, and the application of the first DC voltage DC1 need to be performed in this order.

When the voltage to be applied to the edge ring 14 is switched from the second DC voltage DC2 to the first DC voltage DC1, in a case where the potential difference between the second DC voltage DC2 and the first DC voltage DC1 is removed by using plasma, as illustrated in FIG. 10, the charge removal circuit 320 may be omitted. In such a case, a delay time Dt is set until the first DC voltage DC1 is applied after the second DC voltage DC2 is applied to the edge ring 14.

The plasma processing apparatus 1 of the above embodiments is a capacitively coupled plasma processing apparatus, but the plasma processing apparatus to which the present disclosure is applied is not limited thereto. For example, the plasma processing apparatus may be an inductively coupled plasma processing apparatus.

According to the present disclosure, it is possible to suppress a discharge between a substrate and an edge ring while suitably controlling a tilt angle in an edge area of the substrate during plasma processing.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A plasma processing apparatus comprising:
   a chamber;
   a substrate support disposed in the chamber, the substrate support including a lower electrode;
   an edge ring disposed on the substrate support to radially surround a substrate on an upper surface of the substrate support;
   an upper electrode disposed above the substrate support;
   a first RF power supply;
   a switching unit including a DC power supply circuit and a charge removal circuit, the switching unit switching between the DC power supply circuit and the charge removal circuit;
   a first DC power supply electrically connected to the edge ring via the switching unit; and controller circuitry configured to cause:
   (a) starting supply of a first RF power from the first RF power supply to the upper electrode or the lower electrode;
   (b) after (a), starting the application of a first DC voltage from the first DC power supply to the edge ring when a first delay time elapses;
   (c) after (b), controlling the first DC power supply to stop the supply of the first RF power and the application of the first DC voltage; and
   (d) after (c), controlling the charge removal circuit to start charge removal of the edge ring when a second delay time elapses.

2. The plasma processing apparatus according to claim 1, wherein the first delay time is equal to or longer than a reflection time of the first RF power.

3. The plasma processing apparatus according to claim 1, wherein the first delay time is 0.1 μs to 1000 μs.

4. The plasma processing apparatus according to claim 1, wherein the first delay time is 0.1 μs to 100 μs.

5. The plasma processing apparatus according to claim 1, wherein the first delay time is 1 μs to 300 μs.

6. The plasma processing apparatus according to claim 1, wherein the second delay time is 0.1 μs to 1000 μs.

7. The plasma processing apparatus according to claim 1, further comprising: a second DC power supply configured to apply a second DC voltage to the edge ring after stopping the application of the first DC voltage, the second DC voltage being different from the first DC voltage.

8. The plasma processing apparatus according to claim 1, further comprising: a second RF power supply configured to supply a second RF power to the lower electrode during (a), the second RF power being different from the first RF power.

9. The plasma processing apparatus according to claim 1, wherein the edge ring is made of a conductive material.

10. The plasma processing apparatus according to claim 1, further comprising:
   a second RF filter, wherein
   the first DC power supply is electrically connected to the edge ring via the switching unit, then the second RF filter, and then the first RF filter.

11. The plasma processing apparatus according to claim 1, wherein the DC power supply circuit includes:
   a first switching element; and
   a first damping element,
   the first switching element is one of a field effect transistor (FET), an insulated gate bipolar transistor (IGBT) or a relay, and
   the first damping element is a resistor or a coil.

12. The plasma processing apparatus according to claim 11, wherein the charge removal circuit includes:
   a second switching element; and
   a second damping element,
   the second switching element is one of a field effect transistor (FET), an insulated gate bipolar transistor (IGBT) or a relay, and
   the second damping element is a resistor or a coil.

* * * * *